United States Patent [19]

Gauger et al.

[11] 4,448,803

[45] May 15, 1984

[54] PROCESS FOR MANUFACTURNG A POLYCHELATE COATING

[75] Inventors: Jurgen F. Gauger; Jean M. Hinden; Michael Katz, all of Geneva, Switzerland

[73] Assignee: Diamond Shamrock Corporation, Dallas, Tex.

[21] Appl. No.: 315,852

[22] PCT Filed: Feb. 23, 1981

[86] PCT No.: PCT/US81/00217

§ 371 Date: Oct. 19, 1981

§ 102(e) Date: Oct. 19, 1981

[87] PCT Pub. No.: WO81/02432

PCT Pub. Date: Sep. 3, 1981

[30] Foreign Application Priority Data

Feb. 25, 1980 [GB] United Kingdom ................. 8006230

Feb. 25, 1980 [GB] United Kingdom ................. 8006231

[51] Int. Cl.[3] .............................................. H01L 29/28

[52] U.S. Cl. ....................................... 427/58; 148/6.3; 148/6.31; 148/6.35; 357/8; 427/86; 427/87; 427/115; 427/125; 427/255.6; 427/292; 427/295; 427/309

[58] Field of Search ................ 427/255.6, 86, 87, 115, 427/125, 292, 295, 309; 357/8; 148/6.3, 6.31, 6.35

[56] References Cited

U.S. PATENT DOCUMENTS

| | | | |
|---|---|---|---|
| 2,980,833 | 4/1961 | Epstein | 357/8 |
| 3,405,101 | 10/1968 | Wildi | 357/8 |
| 3,410,727 | 11/1968 | Jasinski | 136/86 |
| 3,585,079 | 6/1971 | Richter et al. | 136/86 A |
| 3,821,028 | 6/1974 | Ziener et al. | 136/86 D |
| 3,930,884 | 1/1976 | Zimmermann et al. | 136/86 D |
| 4,094,893 | 6/1978 | Dines | 260/429 R |
| 4,163,811 | 8/1979 | Kohlmayr et al. | 327/115 |
| 4,179,350 | 12/1979 | Deborski | 204/284 |

FOREIGN PATENT DOCUMENTS 2061398 6/1971 France .

OTHER PUBLICATIONS

Delacote et al., "Electron Injection in Thin Films of Copper Phtalocyanine", Solid State Communications, vol. 2, pp. 373–376, 1964.

Okamoto et al., "Organic Semiconductors", published by Reinhold Publishing Co., pp. 148–157, ©1964.

Hamann et al., "Electrical Properties of Organic/Inorganic Thin Film Sandwiches", Thin Solid Films, vol. 36, No. 1, Jul. 1976, pp. 81–84.

M. Meier et al.: Journal Physical Chemistry, 81, 712 (1977), DE OS No. 25 49 083.

D. Wohrle, in Advances in Polymer Science, vol. 10,35 (1972).

Electrochimica Acta, vol. 21, pp. 567–574 (1976), A. J. Appleby and M. Savy.

V. S. Bagotzsky et al., Journal of Power Sources 2 (1977/78), 223–240.

H. Meier et al., Berichte der Bunsengesellschaft Bd 77, nr. 10/11, 1972.

H. Ziener et al.: Project report to the Federal Ministry for Research and Technology, West Germany, Jul. 1976.

Doklady Akademii Nauk SSR, vol. 136, No. 5, pp. 1127–1129, A. P. Berlin et al.

Japanese Journal of Applied Physics, vol. 4 (12) 977–986, Naraba et al.

Chemistry Letters, pp. 751–754 (1979), K. Haratsuka et al.

*Primary Examiner*—John D. Smith

*Attorney, Agent, or Firm*—John P. Hazzard; Bruce E. Harang

[57] ABSTRACT

A semi-conducting, stable polychelate coating is manufactured in situ on a conducting substrate providing metal coordination centers, by carrying out a controlled chelating reaction and thermal treatment on the substrate surface with a predetermined specific amount ($X_o$) of tetranitrile compound per unit substrate area. The temperature and duration as well as this specific amount ($X_o$) are selected from given ranges to form a uniform polychelate coating bonded to the substrate surface.

Titanium electrodes are provided with such polychelate coatings for different purposes. Electrodes with other metal substrates are further provided with such polychelate coatings.

21 Claims, No Drawings

PROCESS FOR MANUFACTURNG A POLYCHELATE COATING

TECHNICAL FIELD

The invention generally relates to semi-conducting $N_4$-chelate coatings and their manufacture on electrically conducting substrates suitable for producing industrial electrodes of different types.

BACKGROUND ART

Monomeric and polymeric phthalocyanines exhibit interesting electronic, electrocatalytic and photo-electrochemical properties.

Eley and Vartanyian found in 1948 that the conductivity of phthalocyanines increases exponentially with temperature in the form of a Boltzmann distribution, which is typical for so-called intrinsic semi-conductors.

Since then there have been various publications relating to investigations of the influence of the conditions of preparation on the conductivity of monomeric and polymeric phthalocyanines. The following publications may be cited for example:

V.S. Bagotzsky et al in the Journal of Power Sources 2 (1977/78), 233–240

H. Meier et al in Berichte der Bunsengesellschaft Bd 77, nr. 10/11, 1973

H. Ziener et al: Project report to the Federal Ministry for Research and Technology, West Germany, July, 1976

M. Meier et al: Journal Physical Chemistry, 81, 712 (1977) DE OS No. 25 49 083

D. Wohrle, in Advances in Polymer Science, Vol. 10, 35 (1972).

These publications relate to formation of monomer and polymer chelates by reaction in a solution or melt. The resulting monomeric and polymeric chelates (primarily oligomers) are dissolved in concentrated sulphuric acid, diluted in water, deposited on active carbon and processed into a gas-diffusion electrode for oxygen reduction.

It has also been suggested to form polymeric phthalocyanines by a homogenous gas phase reaction of tetracyanobenzene and a volatile metal chelate, dissolution in sulphuric acid, dilution and deposition on a carbon support. This method was described for example by A. J. Appleby and M. Savy in Electrochimica Acta, Vol. 21, pages 567–574 (1976).

A. P. Berlin et al (Doklady Akademii Nauk SSR, Vol. 136, no. 5, pages 1127–1129) describe the formation of very thin films of polymeric complexes obtained from tetracyanoethylene and copper, iron or nickel. The thickness reported in the case of iron corresponded to 0.05–0.3$\mu$. However, such thin films show insufficient chemical resistance in corrosive media.

Naraba et al (Japanese Journal of Applied Physics, Vol. 4 (12) 977–986, describe the preparation of a polytetracyanoethylene chelate film. This work relates primarily to Cu and reports a film thickness of 1 mm, with a significant Cu gradient across the film. This publication describes applying a vacuum of $10^{-5}$ mm Hg and using high frequency heating to get a clean surface; such a procedure is hardly suitable for an industrial process.

In a further publication of K. Hiratsuka et al in Chemistry Letters, pages 751–754, 1979, surface annealing under a hydrogen atmosphere is described as a prerequisite for complete removal of surface oxides prior to chelation. The temperature range of 250°–350° C. and an initial reactant amount related to sample area corresponding to 20–40 $g/m^2$ are mentioned.

Polymeric phthalocyanines can exhibit high electrical conductivities which may be greater by ten orders of magnitude than the conductivities of monomeric phthalocyanines. They may have semi-conducting properties of the n or p type, depending on the conditions of preparation.

$N_4$-chelates and more particularly metal phthalocyanines were found to exhibit interesting catalytic properties for oxygen reduction in fuel cells where acid electrolytes are used to avoid carbonate formation.

Polymeric phthalocyanines of high molecular weight are resistant to attack by acid media and exhibit high catalytic activity for oxygen reduction.

Polymeric phthalocyanines cannot be sublimated, but it has been reported that polymeric films may be obtained after prolonged exposure of metal plates to tetracyanoethylene (TCNE) at elevated temperatures.

However, investigations have shown different methods and conditions of preparation can lead to $N_4$-chelates with quite different electrical and catalytic properties, as well as different molecular weights and chemical or physical stability.

It has also been found that the chemical and physical stability of oligomeric and polymeric $N_4$-chelates depends on the starting materials of the chelates, their purity, the conditions under which they are produced and the structure of the resulting chelate.

Thus, in spite of the evident potential interest which $N_4$-chelates present, their manufacture so as to provide useful industrial products is particularly difficult to achieve in a reproducible manner.

The manufacture of electrodes consisting of $N_4$-chelates has thus not been successfully achieved until now due to the problems of manufacturing satisfactory $N_4$-chelates under controlled conditions on an industrial scale.

The use of $N_4$-chelates as a coating material on a suitable electrically conducting substrate can provide electrodes of different shapes. However, in that case the electrode properties will also depend on the substrate material.

Proper selection of the substrate and chelate forming organic materials is thus important, in addition to suitable manufacturing conditions for the industrial production of electrodes with stable, reproducible performance.

The selected materials must be mutually compatible and also suitable for processing into stable electrodes.

A chelate coating must moreover meet the requirement of satisfactory adherence to the underlying electrode body providing a coating substrate.

Chelates with different central metal atoms can provide different catalytic properties and the selection of chelates for use as electrocatalytic materials must be made according to the intended use in each case.

In order to be able to ensure satisfactory stable performance of electrodes comprising chelates as an electrocatalytic material, loss of metal from the chelate, as well as any other degradation of the chelate by chemical or physical attacks under the operating conditions of the electrode should moreover be avoided as far as possible in each case.

The industrial processing of chelates for the manufacture of electrodes thus presents numerous problems with regard to the proper selection of electrode materials and manufacturing conditions, so as to be able to obtain electrodes with reproducible, satisfactory long-term performance which meet the high technical requirements in each case.

The state of the art relating to electrodes comprising phthalocyanines may be illustrated by U.S. Pat. Nos. 3,585,079 and 4,179,350.

DISCLOSURE OF THE INVENTION

An object of the invention is to provide stable, substantially uniform, semi-conducting coatings formed of $N_4$-chelates bonded to conductive substrates, so as to meet as far as possible all technical requirements with regard to reproducibility, stability and conductivity.

Another object of the invention is to provide electrodes with such chelate coatings wherein a controlled amount of a suitable chelating metal is distributed as evenly as possible throughout the coating.

A further object is to provide such $N_4$-chelate coatings which are substantially stable and insoluble in acid and alkaline media.

The invention more particularly has the object of providing a manufacturing process for the industrial production of such highly stable conducting $N_4$-chelate coatings with reproducible properties suitable for various technical applications.

In order to meet the above-mentioned objects as far as possible, the invention provides a manufacturing process as set forth in the claims and as described in the examples given further on.

The expression metal coordination centres as used herein with reference to the invention is meant to cover metal in the metallic state, as well as in any other form suitable for providing central metal ions attached by coordinate links to the ligands of the $N_4$-chelate network.

The process of the invention as set forth in the claims is intended for the industrial manufacture of stable, substantially uniform, semi-conducting polychelate coatings in a reproducible manner on electrically conducting substrates suitable for providing electrodes of different types with satisfactory, stable long-term performance.

In order to meet the essential technical requirements of high reproducibility, stability, conductivity and adherence of the polychelate coating, the process of the invention essentially provides controlled manufacturing conditions for the synthesis of an $N_4$-chelate coating of predetermined, limited thickness formed in situ on the substrate surface by controlled heterogeneous reaction with a tetranitrile compound in the vapour phase, as well as for its subsequent conversion by controlled thermal treatment to a substantially uniform, stable polychelate coating having satisfactory, reproducible properties suitable for various technical applications.

The process of the invention is thus more particularly intended to substantially control the various factors which can ensure the desired physical and chemical properties of the polychelate coating, while eliminating as far as possible all uncontrolled side effects which could affect the reproducibility of these coating properties.

In order to ensure high reproducibility and product purity, the process of the invention may be advantageously carried out as described further below in the examples, by effecting the controlled chelating reaction with a tetranitrile compound forming the vapour phase, without any additional gaseous components which might lead to uncontrolled side effects and undesirable properties of the resulting polychelate coating.

The chelating reaction is carried out in the process of the invention at a controlled temperature lying within the range of thermal stability, i.e. below the thermal decomposition temperature, of the tetranitrile compound used to manufacture the polychelate coating in each case.

One can thus ensure that a substantially pure tetranitrile compound is present in the vapour phase for the desired chelating reaction on the substrate surface.

The most suitable temperature for carrying out the chelating reaction in a reproducible manner with a satisfactory yield can be empirically established by preliminary experiments for each chelate/substrate system used.

An experimental program carried out within the framework of the invention has moreover shown that the manufacturing process may be advantageously carried out at higher temperatures within the said thermal stability range.

In accordance with the process of the invention, the amount ($X_o$) of tetranitrile compound which is brought into the vapour phase, per unit substrate surface area available for the chelating reaction, is also carefully controlled, so as to restrict accordingly the specific amount (X) of chelate produced per unit area.

The thickness of the resulting chelate coating is thus restricted in accordance with the invention, by limiting the specific amount ($X_o$) of tetranitrile compound brought into the vapour phase, in order to thereby make available only such a limited amount of this gaseous reactant as can be effectively chelated throughout the entire coating on the substrate surface, and to thereby provide a substantially uniform chelate coating with reproducible properties.

On the other hand, if no such restriction of the available amount of reactant were made in accordance with the invention, excess reactant in the vapour phase may further lead to the deposition of uncontrolled amounts of unchelated tetranitrile compound which is not convertible to the desired polychelate coating. This would in turn provide a non-uniform coating with variable and unpredictable composition, structure and properties, as well as a significant reduction of the conductivity and stability, which could hardly provide electrodes with stable long-term performance.

Said experimental program relating to the invention has shown that the yield of the chelate formed on the substrate may vary considerably and will depend on various parameters such as reaction temperature, specific amount ($X_o$) of reactant available per unit substrate surface area, and type of pretreatment of the substrate surface.

The chelate yield will moreover depend on the design of the reactor used for the chelating reaction, as well as its dimensions relative to the substrate surface.

A small reaction vessel was used in said experimental program which showed that stable, adherent polychelate coatings may be obtained in accordance with the invention under different operating conditions.

In said experimental program relating to the invention, the specific amount ($X_o$) of tetranitrile compound available in the vapour phase per unit surface area was varied from about 1 $g/m^2$ to 20 $g/m^2$, the temperature from 350° C. to 600° C. and the total duration from 1 to 24 hours. The substrate surface was moreover pretreated by sandblasting, etching with an acid or base, and polishing.

Stable, conducting, adherent polychelate coatings were obtained under different operating conditions within the ranges indicated above, with tetracyanobenzene (TCB) and tetracyanoethylene (TCNE), and on iron (0.5% C), stainless steel (AISI 316L), nickel titanium and graphite plate substrate samples.

The following tetranitrile compounds were successfully used to manufacture polychelate coatings on titanium plates and other sheet substrates in accordance with the present invention:

tetracyanobenzene
tetracyanoethylene
tetracyanopyrazine
tetracyanothiopene
tetracyanodiphenyl
tetracyanodiphenyl ether
tetracyanodiphenyl sulfone
tetracyanofurane
tetracyanonaphthalene
tetracyanopyridine
tetracyanobenzophenone.

It is understood, however, that other suitable tetranitrile compounds could also be used to manufacture polychelate coatings in accordance with the invention.

Stable, adherent polychelate coatings with excellent physical and chemical properties were manufactured on titanium plates in accordance with the invention. Good results may likewise be obtained with substrates of other electrochemical valve metals such as Ta, Zr, No, Nb, W known to have filmforming properties which render them particularly suitable for providing corrosion-resistant electrode substrates.

The metals which used to produce a polychelate coating in accordance with the invention may form the entire substrate body or be disposed at its surface to provide the metal coordination centres for the chelating reaction.

For this purpose, other base metals such as for example cobalt, iron, nickel, aluminium and copper may also be used, either alone or in any suitable combination, for example with titanium or other valve metal mentioned above. Noble metals such as the platinum-group metals may also be used to provide suitable metal coordination centres, as well as any other purpose, for example to provide catalytic properties and/or increase the substrate stability.

It is understood that such metals which may be suitable for the invention can be combined in different ways, for example as an alloy which either forms the entire substrate body or only covers the substrate surface.

The substrate body may also have any suitable size or shape such as, for example a plate, grid or rod.

The substrate body may, moreover, have a porous surface for carrying out the chelating reaction.

The substrate surface area available for carrying out the controlled chelating reaction in accordance with the invention may be advantageously increased as far as possible so as to increase accordingly the total reaction surface thus made available with respect to the projected area of the substrate body.

Such an increase of the specific surface area available for the chelating reaction per unit projected area of the substrate, is of particular significance for providing a corresponding increase of the metal coordination sites which are made available for chelation. An adequate number of metal coordination sites can thereby be ensured for manufacturing a substantially uniform, stable polychelate coating of desired thickness in accordance with the invention.

It may thus be noted that said experimental program relating to the invention has established that surface treatment of the substrate body can be particularly important for manufacturing satisfactory polychelate coatings in a reproducible manner according to the present invention.

It was found that roughening the substrate surface to increase the available reaction area is more particularly advantageous for increasing the amount (X) and yield ($X/X_o$) of polychelate which is obtained per unit projected area of the substrate.

This could be seen from the fact that pretreatment of the substrate surface by sandblasting, or etching, generally provided higher polychelate yields than polished substrates when manufacturing polychelate coatings within relatively broad ranges of the specific initial amount $X_o$ of tetranitrile compound, temperature and duration of the chelating reaction and thermal treatment.

It should moreover be noted that thermal pretreatment of the substrate body under vacuum, as is described more particularly with reference to titanium substrates in the examples further on, was found to provide significant improvements of the electrical properties of polychelate coatings produced in accordance with the invention.

These improvements were clearly established experimentally and clearly show that such a thermal pretreatment under vacuum may be advantageously applied, especially when titanium or other valve metal substrates are used to carry out the invention.

A substantially pure, uniform polychelate coating of desired, predetermined thickness can be manufactured in a highly reproducible manner by bringing a predetermined specific amount ($X_o$) of any suitable substantially pure tetranitrile compound into a vapour phase which does not contain any impurities that could affect the chelating reaction and by carefully controlling the temperature and duration of the chelating reaction and the thermal treatment so as to produce a uniform polychelate coating with reproducible properties.

Said specific amount ($X_o$) of the tetranitrile compound which is brought into the vapour phase may be selected within given ranges which may generally depend more or less on this compound, the substrate used and the reaction temperature.

Thus, for example, said experimental investigations have shown that the following ranges should be preferably selected for manufacturing polychelate coatings from tetracyanobenzene (TCB) on substrates of titanium, iron (1% C steel), stainless steel and nickel:

$X_o$=5–10 g TCB/m$^2$; temperature (T)=400°–550° C.; duration (t)=12–24 hours.

Satisfactory coatings were obtained more particularly on titanium with $X_o$=5 g TCB/m$^2$; T=400° C., t=24 hours. Improved results were further obtained by thermal pretreatment of the titanium substrate under vacuum as described in the examples further on, but with t=5 hours, $X_o$ and T being the same (5 g TCB/m$^2$, 400° C.).

In the case of iron, good coatings were obtained with $X_o$=5 g TCB/m$^2$; T=500° C. and t=12–24 hours. For stainless steel the best conditions found were $X_o=10$ g $TCB/m^2$, T=500° C. and t=24 hours. A pretreatment by sandblasting provides the best results in both cases.

For nickel substrates, the best results were obtained with: $X_o=10$ g $TCB/m^2$, T=450° C., t=24 hours. In this case, pretreatment with 25% NaOH provided the best results.

It was moreover established that the following ranges should preferably be used for manufacturing polychelate coatings from tetracyanoethylene (TCNE) on titanium, iron and stainless steel substrates:

$X_o=5$–$10$ g/m$^2$ $T=400°$–$600°$ C.

$t=12$–$24$ hours.

Good results were obtained on titanium with: 5 g $TCNE/m^2$, 400° C., 24 hours and 10 g $TCNE/m^2$, 600° C., 24 hours.

On iron and stainless steel, good results were obtained with: 5–10 g $TCNE/m^2$, 550°–600° C., 24 hours.

On nickel, good results were obtained with: 5 g $TCNE/m^2$, 550° C., 24 hours.

Sandblasting was found to be the most advantageous surface pretreatment for iron, stainless steel and nickel.

The temperature ranges given above could further be considered reduced by adding a suitable catalyst. Thus, for example, an addition of 3% urea allowed the chelating reaction to be carried out at 350° C. with TCB and TCNE.

Such a catalyst may be added to further reduce the temperature which may be necessary in the case of substrates having lower melting points.

The controlled thermal treatment carried out according to the invention essentially provides cross-linking and conversion to a substantially uniform, insoluble polychelate coating of high molecular weight.

This thermal treatment may be advantageously carried out together with the chelating reaction as described more fully. However, it may also be carried out in a subsequent separate step under controlled conditions which may be different.

The polychelate coating may also be manufactured in several successive steps, according to the invention, so as to gradually build up a thicker coating (e.g. above 10 microns) composed of several layers. In that case, additional metal centres may be applied to each layer in any suitable way or by codeposition with the tetranitrile compound from the vapour phase.

Moreover, different types of metal centres may be incorporated in the polychelate coatings according to the invention in order to provide "mixed" chelates and to thereby combine useful (complementary) properties of different chelating metals.

As may further be seen from the examples below, the polychelate coating according to the invention may also be used advantageously as an undercoating for an outer electrocatalytic coating of any suitable type.

The polychelate coating may also be manufactured according to the invention from a tetranitrile compound present in an inert atmosphere to prevent oxidation and contamination of the polychelate.

The present invention further provides a chelate-coated electrode as set forth in the claims, with a substrate which comprises a valve metal such as titanium, and may form an electrode base or support body, as described more fully in the examples.

The following examples serve to illustrate various embodiments and advantages of the present invention.

EXAMPLE 1

Titanium sheet samples with a surface area of 2 cm$^2$ were mechanically polished and then provided with a polychelate coating. The coating was produced by placing each pretreated polished sample, together with a predetermined specific amount ($X_o$) of tetracyanobenzene (TCB) in a vessel of heat resistant glass, which was then evacuated to a vacuum of about $10^{-3}$ Torr, sealed, and heated at 400° C. for 24 hours.

Polychelate coatings were respectively produced on three mechanically polished samples, but with different specific amounts ($X_o$) of TCB corresponding respectively to 0.5, 1 and 8 mg $TCB/m^2$ of the sample surface. A uniform, adherent polychelate was thus obtained on each of these three samples.

The three resulting coated samples were tested in an electrochemical cell by effecting cyclic voltametric measurements in a 1N$K_2SO_4$ aqueous solution containing a 1 mM ferri/ferrocyanide redox couple. These measurements were effected in the voltage range +0.85 V to +0.1 V vs. NHE (with respect to a normal hydrogen electrode).

These tests showed that the highest cathodic/anodic peak current densities (160/190 $\mu$A/cm$^2$) at the first cycle were obtained with the coated sample produced under the described conditions with the smallest amount of TCB ($X_o=0.5$ mg/cm$^2$), and that the peak current densities measured at the tenth cycle (149/175 $\mu$A/cm$^2$) indicate adequate reproducibility. For the two other samples, with $X_o=1$ and 8 mg $TCB/cm^2$, the measured peak current densities were both lower than for $X_o=0.5$ mg $TCB/cm^2$ (136/142 and 116/107 $\mu$A/cm$^2$ respectively for $X_o=1$ and 8 mg $TCB/cm^2$ at the first cycle, and 135/114 and 71/86 $\mu$A/cm$^2$ at the tenth cycle).

Another four titanium samples (2 cm$^2$) were also polished and provided with a polychelate coating produced with an amount ($X_o$) of TCB corresponding to 0.5 mg/cm$^2$ in the manner described above, but with different heating periods corresponding respectively to 1,2,5 and 48 hours.

These further four samples were also tested by cyclic voltametric measurements which showed that lower peak current densities were obtained with these samples produced with different heating periods (first cycle: about 8 $\mu$A/cm$^2$ for 1 to 2 hours, 123/114 $\mu$A/cm$^2$ for 48 hours vs. 160/190 for 24 hours).

EXAMPLE 2

A titanium sheet sample with a surface area of 2 cm$^2$ was mechanically polished and further pretreated in a vessel which was evacuated to a vacuum of about $10^{-3}$ Torr, sealed, heated at 400° C. for 24 hours, and finally cooled to room temperature.

The polished titanium sample thus pretreated under vacuum was then provided with a polychelate coating obtained from TCB in an amount $X_o$ corresponding to 0.5 mg/cm$^2$ in a reactor vessel which was evacuated to a vacuum of about $10^{-3}$ Torr, sealed and heated at 400° C. for 5 hours, as already described in Example 1.

The resulting coated sample thus obtained had a uniform, adherent polychelate coating and was tested under the same conditions already described in the preceding Example 1.

Cyclic voltametric measurements carried out with this sample provided very high cathodic and anodic peak current densities at the first cycle (285/265 $\mu A/cm^2$ with 110 mV peak separation) and also at the tenth cycle (250/214 $\mu A/cm^2$ with 180 mV peak separation), which indicate good reproducibility.

These results compare favourably with those obtained with a platinum electrode (first cycle: 266/338 $\mu A/cm^2$ with 86 mV peak separation), and show that the described pretreatment under vacuum provides a significant improvement with respect to the results obtained in Example 1 without such a vacuum pretreatment, but under otherwise similar conditions.

EXAMPLE 3

A titanium sheet sample pretreated and coated as described in Example 2, was subjected to a test to determine its photoelectrochemical behaviour. In this test, the coated sample was immersed in a sulphate solution at pH1 and exposed to a simulated solar illumination corresponding to 1000 $W/m^2$ (one sun) to obtain a polarization curve. A maximum photocurrent of 1.43 $mA/cm^2$ was measured under these conditions.

EXAMPLE 4

A titanium sheet sample with a surface area of 2 $cm^2$ was mechanically polished and provided with a polychelate coating produced from tetracyanoethylene (TCNE) in an amount ($X_o$) corresponding to 0.5 $mg/cm^2$ by heating for 24 hours at 400° C., in a sealed reactor vessel previously evacuated to about $10^{-3}$ Torr, in the same manner already generally described in Example 1.

The coated sample thus obtained was also tested by cyclic voltametric measurements under the same conditions already described in Example 1.

The anodic and cathodic current density peaks measured after the first cycle both corresponded to 162 $\mu A/cm^2$, with a peak separation of 79 mV. After 10 cycles, these current densities corresponded respectively to 143 and 157 $\mu A/cm^2$.

These results are comparable with those obtained in Example 1 under similar conditions.

EXAMPLE 5

A titanium sample with a surface area of 2 $cm^2$ was mechanically polished and provided with a polychelate coating produced from tetracyanothiophene, under the same conditions as in Example 2.

The coated sample thus obtained was also tested by cyclic voltametric measurements under the same conditions as already described in Example 1. In this case, the anodic and cathodic peak current densities measured corresponded to 61 and 81 $\mu A/cm^2$ respectively.

EXAMPLE 6

A titanium sheet sample with a surface area of 15 $cm^2$ was first subjected to surface treatment by sandblasting and etching in oxalic acid for 6 h.

A polychelate coating formed from tetracyanoethylene (TCNE) was applied by placing the pretreated titanium sample, together with 15 mg TCNE, in a vessel of heat resistant glass, which was then evacuated to a vacuum of about $10^{-2}$ to $10^{-3}$ Torr, sealed, heated to 600° C. and maintained for 24 hours at this temperature to carry out a chelating reaction and thermal treatment for polychelation. After cooling to room temperature the sample obtained was covered with an adherent uniform polychelate coating corresponding to 3 $g/m^2$ and a thickness of about 2.5–3$\mu$.

The coating showed excellent chemical resistance in $H_2SO_4$.

EXAMPLE 7

A titanium sheet sample with a surface area of 15 $cm^2$ was first subjected to surface treatment by sandblasting and etching in oxalic acid for 6 hours.

A polychelate coating formed from tetracyanoethylene (TCNE) was then applied by placing the pretreated titanium sample, together with 15 mg TCNE, in a vessel (200 ml) of heat resistant glass, which was then evacuated to a vacuum of about $10^{-2}$ to $10^{-3}$ Torr, sealed, heated to 550° C. and maintained for 24 hours at this temperature. After slow cooling to room temperature, the sample obtained was provided with an adherent polychelate coating corresponding to about 0.1 $mg/cm^2$ (about 1 micron).

The resulting polychelate coating was then topcoated with a catalytic outer coating of tantalum-iridium oxide. This topcoating was formed by successively applying 4 layers of a solution comprising tantalum chloride and iridium chloride in alcohol (ethylalcohol and isopropylalcohol) in amounts corresponding respectively to 8.2 mg Ta/g soln. and 15.3 mg Ir/g soln. After applying each layer of solution, it was dried and thermally treated at 520° C. for 7.5 minutes in a static air atmosphere, so as to finally obtain a topcoating of oxide comprising tantalum and iridium in amounts corresponding respectively to 0.6 g $Ta/m^2$ and 1.2 g $Ir/m^2$ with respect to the sample area.

The resulting titanium sample with a polychelate intermediate coating and a Ta-Ir oxide catalytic outer coating was subjected to an accelerated test as an oxygen evolving anode at 7500 $A/m^2$ in an electrolysis cell containing 150 g/l $H_2SO_4$ aqueous solution. This test anode sample had an initial potential of 1.99 V/NHE (vs. normal hydrogen electrode) and failed after 180 hours operation at 7500 $A/m^2$.

By way of comparison, it may be noted that a similar test sample without an intermediate polychelate coating, i.e. coated only with tantalum-iridium oxide at a higher loading (0.8 g $Ta/m^2$ and 1/5 g $Ir/m^2$), failed after only 120 hours under the same test conditions.

EXAMPLE 8

A titanium sample was pretreated and provided with a polychelate coating in the manner already described in the preceding Example 7.

However, in this case the polychelate coating was topcoated with a different type of catalytic oxide coating comprising titanium (2.8 g $Ti/m^2$), ruthenium (1.6 g $Ru/m^2$) and tin (1.3 g $Sn/m^2$). This topcoating was prepared from a corresponding solution, which was applied and converted to oxide in the manner already described in the preceding Example 7.

The resulting titanium sample with an intermediate polychelate coating and an outer catalytic coating of Ti-Ru-Sn oxide was tested, with periodic current reversal, in an electrolysis cell containing 2 g NaCl/l aqueous solution. In this electrolytic test, the coated sample was operated as an anode at a current density of 300 $A/m^2$ for periods of 12 hours while the electrolysis current was cyclically reversed and the sample was each time operated cathodically at 50 $A/m^2$ for 15 minutes, between successive 12 hour periods of anodic operation. This coated test sample had an initial anode potential of 1.44 V/NHE and operated for 360 hours in this current reversal test under the described conditions.

EXAMPLE 9

A sheet of iron (1% C steel) with a surface area of 15 $cm^2$ was pretreated by sandblasting and degreasing.

A polychelate was then formed on the pretreated iron sample by placing it together with 8 mg of tetracyanoethylene (TCNE) in a reaction vessel of heat resistant glass, which was evacuated to a vacuum of about $10^{-3}$ Torr, sealed and heated at 600° C. for 24 hours. A uniform polychelate coating firmly adhering to the iron plate was thus obtained. The excellent adherence properties were verified by a scotch tape test. The specific coating weight corresponds to 3.9 $g/m^2$. The coating shows good chemical resistance in 15% $H_2SO_4$.

In another two tests the initial amount of TCNE was increased to 15 and 30 mg. The respective specific coating weights obtained at 600° C. after a reaction time of 24 hours were 4.4 and 4.7 $g/m^2$. As seen from these specific coating weights there is a considerable decline in product yield for the higher initial TCNE amount of 30 mg ($X_o$=20 $g/m^2$) vs. $X_o$ of 5 and 10 $g/m^2$.

The effect of reaction temperature was shown by running comparative tests with an initial TCNE amount of 5.0 and 10 $g/m^2$ at 400° C., 500° C. and 600° C. A considerable increase in the specific coating weight can be observed by increasing the reaction temperature from 400° to 500° C. while maintaining the reaction duration at 24 h. This was particularly critical for obtaining sufficient chemical resistance in very corrosive media such as $H_2SO_4$. Upon further increase of temperature to 600° C. the amount of polychelate corresponds to 3.9 as shown above.

The coatings on acid pretreated and mechanically polished iron samples, obtained under identical conditions at 600° C., showed less adherence. This does not apply for 550° C. for a shorter duration of 12 h.

This trend applies also to iron alloys such as for example AISI 316L stainless steel.

The pretreatment and process conditions were identical to those applied to iron sheet samples.

A detailed investigation of the heating duration, after the vessel has been sealed, shows that at 550° C. there is a successive increase in deposited amount i.e. in film thickness up to 24 h duration and a decrease upon further increase to 64 h.

EXAMPLE 10

A sheet sample of stainless steel (AISI 316L; 50×15×1 mm) with a surface area of 15 $cm^2$ was pretreated by etching in 20% $H_2SO_4$ aqueous solution at 50° C. for 1 hour.

A polychelate coating was then formed on the pretreated steel sample by placing it together with 8 mg of tetracyanoethylene (TCNE) in a reaction vessel of heat resistant glass, which was evacuated to a vacuum of about $10^{-3}$ Torr, sealed and heated at 550° C. for 12 hours. A uniform polychelate coating firmly adhering to the steel plate was thus obtained.

This coated sample was tested as an oxygen evolving anode operating at a current density of 4500 $A/m^2$ in an electrolysis cell containing an aqueous NaOH solution with a concentration of 300 g/l. This test sample had an initial anode potential of 0.79 V vs. Hg/HgO reference electrode at 4500 $A/m^2$ and operated for 340 hours under these conditions.

EXAMPLE 11

A sheet sample of stainless steel (AISI 316L) with a surface area of 15 $cm^2$ was pretreated by sandblasting and precoated with a polymeric layer containing platinum. This precoating was obtained by successively applying 8 layers of a solution of polyacrylonitrile (PAN) and platinum chloride in dimethylformamide (DMF). After applying each layer of solution, it was dried and thermally treated for 10 minutes at 250° C. in static air. After applying and heat treating each of the 8 layers, a further heat treatment was carried out for 20 minutes at 300° C. in a flow of air.

A polychelate coating was then formed by placing the pretreated sample, together with 30 mg tetracyanoethylene (TCNE), in a glass vessel which was then evacuated to about $10^{-3}$ Torr, sealed and heated at 600° C. for 24 hours. A uniform polychelate coating firmly adhering to the precoated steel sheet sample was thus obtained with a specific polychelate coating weight corresponding to 6.2 $g/m^2$ of the sheet substrate area.

This coated sample was tested as a hydrogen evolving cathode operating at a current density of 4500 $A/m^2$ in an electrolysis cell containing an aqueous solution of NaOH at a concentration of 135 g/l and at a temperature of 90° C.

This test sample was still operating after 800 hours under the described conditions at a cathode potential of −1.41 V vs. Hg/HgO normal reference electrode. It may be noted that this operation was interrupted during the weekends.

EXAMPLE 12

A nickel sheet sample (99% Ni; 50×15×1 mm) with a surface area of 15 $cm^2$ was pretreated by sandblasting (with $SiO_2$) and degreasing with carbon tetrachloride in an ultrasonic cleaner.

A polychelate coating was next produced by placing the pretreated nickel sample, together with tetracyanoethylene (TCNE) in a specific amount $X_o$ corresponding to 1 mg TCNE/$cm^2$ of the sample, in a heat resistant glass vessel which was evacuated, sealed under a vacuum of $10^{-2}$ Torr, and heated at 500° C. for 24 hours. The resulting coated sample was covered with a very uniform, adherent nickel-phthalocyanine coating with a thickness of 1.5$\mu$.

This coated sample was tested as a hydrogen evolving cathode operating at a current density of 2500 $A/m^2$ in 6 N NaOH aqueous solution at 40° C. It operated for 3 months under these conditions and provided throughout this period a 60 mV voltage saving with respect to a similar nickel reference electrode sample which was likewise pretreated as described, but was not provided with a polychelate coating.

The coated test sample was inspected by microscope after having operated for 3 months under the described conditions. No trace of deterioration of the coating was detected by microscope after this operating period of 3 months.

EXAMPLE 13

A sheet sample of nickel with a surface area of 15 $cm^2$ was pretreated by sandblasting and degreasing.

A polychelate coating formed from tetracyanoethylene (TCNE) was applied by placing the pretreated nickel sample together with 15 mg TCNE in a vessel of heat resistant glass, which was then evacuated to a vacuum of about $10^{-2}$ Torr, sealed, heated to 550° C. and maintained for 24 hours at this temperature. The resulting coated sample was covered with a very uniform, adherent nickel-polyphthalocyanine coating with a thickness of 1.5μ.

Reaction with 30 mg TCNE under identical conditions showed no significant change in coating thickness.

When applying an alkaline pretreatment and then carrying out the process at 550° C. for 24h in the manner described above but with an initial TCNE amount of 15 and 30 mg corresponding to 10 and 20 g/m$^2$ respectively, the amount deposited with $X_o=20$ surpasses the respective values obtained for sandblasted samples under identical conditions, but the adherence was somewhat less.

The chelate coatings manufactured in situ on a substrate body in accordance with the invention may be advantageously used for various applications where stable, semi-conducting chelate coatings may provide technical or economic advantages, more especially to provide electrodes of different types, such as catalytic electrodes.

A substrate body provided with a chelate coating according to the invention may either be used as such or further provided with an additional outer coating for any desired purpose such as a catalytic outer coating suitable for carrying out various technical processes.

We claim:

1. A process for forming a stable, bonded, electrically conducting, polychelate coating on an electrically conductive substrate surface providing metal coordination centers therein which comprises: contacting said surface with a vaporized tetranitrile compound in amounts of not more than about 10 grams per square meter of said surface at temperatures between about 400° and 600° C. for a time period of between about 12 and about 24 hours and under conditions carefully controlled to avoid substantial thermal decomposition of said tetranitrile compound or other undesirable competing reactions, thereby achieving a cross-linked, relatively insoluble polychelate coating bonded to the substrate via said metal coordination centers.

2. The process of claim 1, characterized in that said substrate surface comprises an electrochemical valve metal or a valve metal alloy.

3. The process of claim 2, characterized in that the substrate comprises titanium.

4. The process of claim 1, 2 or 3 characterized in that the substrate surface is pretreated by heating under a vacuum of $10^{-2}$ to $10^{-3}$ Torr before contacting some with tetronitrile.

5. The process of claim 1 or 2, characterized in that said compound in the vapour phase is a cyclic tetranitrile compound.

6. The process according to any one of claims 1, characterized in that said tetranitrile compound is tetracyanobenzene, 550° being maximum temperature.

7. The process according to any one of claims 1, characterized in that said tetranitrile compound is tetracyanoethylene.

8. The process of claim 1, characterized in that the specific amount of tetranitrile compound provided in the vapour phase per unit area of the substrate surface is at least 1 g/m$^2$.

9. The process of claim 8, characterized in that the substrate body comprises at least one metal selected from the group consisting of cobalt, iron, nickel, copper and aluminium, or an alloy thereof.

10. The process of claim 9, characterized in that said specific amount of tetranitrile compound is selected from the range between 5 and 10 g/m$^2$.

11. The process of claim 1, characterized in that the substrate is pretreated by sandblasting before contacting some with tetronitrile.

12. The process of claim 1, characterized in that said substrate surface comprises a platinum-group metal providing metal coordination sites for said heterogeneous in situ vapor phase reaction.

13. A process for manufacturing a stable, electrically conducting polychelate coating formed on an electrically conducting substrate body by carrying out a heterogeneous chelating reaction between a tetranitrile compound vapor and metal coordination centers on the surface of the substrate body, characterized in that:

(a) a controlled chelating reaction is carried out by bringing the substrate body into contact with tetracyanobenzene vapor in a restricted specific amount ($X_o$) at most equal to 10 g/m$^2$ of said surface of the substrate body, so as to thereby allow substantially complete chelation of this restricted amount ($X_o$) by means of the metal on said surface, and by carrying out the chelating reaction at a temperature between 400° C. and 550° C., so as to convert this restricted amount of tetracyanobenzene into a corresponding chelate coating in a restricted amount (X) sufficient to provide substantially complete chelation throughout this coating;

(b) the chelate coating produced by the controlled reaction in step (a) is subjected to a controlled thermal treatment at a temperature between 400° C. and 550° C. so as to convert this chelate coating into a corresponding polychelate and to thereby produce a stable, insoluble, electrically conducting poly-chelate coating formed and bonded to said substrate surface by means of said metal coordination centers provided by the substrate body; and (c) said chelating reaction (a) and said thermal treatment (b) being carried out in 12 to 24 hours so as to provide substantially insoluble and well bonded polychelate coating, while avoiding thermal decomposition of said chelate or said polychelate.

14. The process of claims 10, 1 or 13 wherein the substrate comprises nickel or a nickel alloy.

15. The process of claim 14, characterized in that the substrate surface is pretreated with a base, preferably sodium hydroxide.

16. The process of claim 10, 1 or 13 wherein the substrate comprises iron or an iron alloy.

17. A process for manufacturing a stable, electrically conducting polychelate coating formed on an electrically conducting substrate body by carrying out a heterogeneous chelating reaction between a tetranitrile compound vapor and metal coordination centers on the surface of the substrate body, characterized in that:

(a) a controlled chelating reaction is carried out by bringing the substrate body into contact with tetracyanoethylene vapor in a restricted specific amount ($X_o$) at most equal to 10 g/m$^2$ of said surface of the substrate body, so as to thereby allow substantially complete chelation of this restricted amount ($X_o$) by means of the chelating metal on said surface, and by carrying out the chelating reaction at a temperature between 400° C. and 600° C., so as to convert this restricted amount of tetracyanoethylene into a corresponding chelate coating in a restricted amount (X) sufficient to provide substantially complete chelation throughout this coating;

(b) the chelate coating performed by the controlled reaction in step (a) is subjected to a controlled thermal treatment at a temperature between 400° C. and 600° C., so as to convert this chelate coating into a corresponding polychelate and to thereby produce stable, insoluble, electrically conducting poly-chelate coating formed and bonded to said substrate surface by means of said metal coordination centers provided by the substrate body; and (c) said chelating reaction (a) and said thermal treatment (b) being carried out in 12 to 24 hours so as to provide substantially insoluble and well bonded polychelate coating, while avoiding thermal decomposition of said chelate or said polychelate.

18. The process of claim 13 or 17, characterized in that the substrate body and said restricted specific amount ($X_o$) of the tetranitrile compound in solid form are placed in a vessel which is evacuated to a vacuum of about $10^{-2}$ to $10^{-3}$ Torr, sealed and then heated so as to carry out said controlled heterogeneous in either vapor phase reaction and thermal treatment.

19. The process of claim 13 or 17, characterized in that a catalytic outer coating is further applied onto said polychelate coating.

20. The process of claim 19, characterized in that said catalytic coating comprises a platinum-group metal.

21. The process of claim 13 or 17, characterized in that said chelating reaction and said thermal treatment are carried out in a protective atmosphere to prevent oxidation of said coating or surface.

* * * * *

UNITED STATES PATENT AND TRADEMARK OFFICE
CERTIFICATE OF CORRECTION

PATENT NO. : 4,448,803

DATED : May 15, 1984

INVENTOR(S) : Gauger et al

It is certified that error appears in the above-identified patent and that said Letters Patent are hereby corrected as shown below:

In Claim 4, Column 13, line 52, delete "some" and insert --same--.

In Claim 4, Column 13, line 53, delete "tetronitrile" and insert --tetranitrile--.

In Claim 11, Column 14, line 8, delete "some" and insert --same--.

In Claim 11, Column 14, line 8, delete "tetronitrile" and insert --tetranitrile--.

Signed and Sealed this

*Eighteenth* Day of *September 1984*

[SEAL]

*Attest:*

GERALD J. MOSSINGHOFF

*Attesting Officer* *Commissioner of Patents and Trademarks*